United States Patent [19]

Speraw et al.

[11] Patent Number: 4,665,467
[45] Date of Patent: May 12, 1987

[54] HEAT TRANSFER MOUNTING DEVICE

[75] Inventors: Floyd G. Speraw, Lexington; Frank W. Cabaniss, Columbia, both of S.C.

[73] Assignee: NCR Corporation, Dayton, Ohio

[21] Appl. No.: 830,027

[22] Filed: Feb. 18, 1986

[51] Int. Cl.[4] .............................................. H05K 7/20
[52] U.S. Cl. ................................ 361/388; 174/16 HS; 165/185
[58] Field of Search ..................... 357/81; 174/16 HS; 165/185, 80; 361/383, 386, 387, 388, 400, 395, 399

[56] References Cited

U.S. PATENT DOCUMENTS

| | | | |
|---|---|---|---|
| 3,193,707 | 7/1965 | Yanai | 174/16 HS |
| 3,412,566 | 11/1968 | Townsend | 165/185 |
| 3,611,046 | 10/1971 | Covert | 361/388 |
| 3,686,533 | 8/1972 | Garnier | 361/388 |
| 3,738,423 | 6/1973 | Fleissner | 165/185 |
| 3,774,078 | 11/1973 | Martin | 174/16 HS |
| 4,090,056 | 5/1978 | Lockwood | 165/185 |

Primary Examiner—G. P. Tolin
Attorney, Agent, or Firm—Wilbert Hawk, Jr.; Edward Dugas

[57] ABSTRACT

A heat transfer and mounting device having a cross-bar member and at least one leg member. A fastener receptacle is positioned in the cross-bar member for a fastener to affix a heat generating device to the surface of the cross-bar member opposite the at least one leg member. Another fastener receptacle is positioned in the cross-bar member for receiving a fastener to affix a circuit board to the surface of the cross-bar member from which the leg member projects. An additional fastener opening is positioned through the cross-bar member and the leg member for receiving a fastener for attaching the heat conducting body to a heat sink.

6 Claims, 4 Drawing Figures

FIG. I

HEAT TRANSFER MOUNTING DEVICE

BACKGROUND OF THE INVENTION

This invention relates generally to mounting devices which function to transfer heat from a source, such as an electronic device, to a heat sink.

In the design of a power converter, printed circuit boards, with electronic devices affixed thereto, were thermally attached to a chassis. Air passages were used to direct cooling air over and under the printed circuit boards to further aid in the heat removal process. A problem occurred when a plurality of power modules, each having an aluminum plate with encapsulated electronic components mounted to one surface of the plate and several contact pins extending from the encapsulated electronic components opposite the surface mounted to the plate, had to be connected to the printed circuit board. The aluminum plate had to face away from the printed circuit board and the chassis to permit the power modules' contact pins to be connected to conductors on the printed circuit board. The chassis would provide an excellent heat sink but the chassis was mounted below the printed circuit board and the aluminum plate thus would be on the side of the power module farthest from the printed circuit board. The surface temperature of the aluminum plate, during the operation of the power module, was such that it had to be cooled. Applying conventional heat sinks to the aluminum plate makes the replacement, addition, or deletion of power modules from the circuit board difficult.

The prior art approach to heat transfer problems is exemplified by the arrangement shown in U.S. Pat. No. 3,518,493 entitled "Arrangement for Mounting and Connecting Microelectronic Circuits", by J. R. Bathrick, Jr. et al. In this patent there is disclosed a heat sink that is formed from a pair of parallel elongated metal strips. Electronic components are placed in thermal contact with the outer sides of the metal strips and printed circuit boards are positioned along the top and the bottom edges of the elongated metal strips with conductors running therebetween. This particular arrangement does not allow for an easy removal of the electronic components nor does it allow for the addition of components if desired.

Another heat sink of interest is disclosed in U.S. Pat. No. 3,676,745 entitled "Electronic Assembly Utilizing Thermal Panel for Heat Sink", by J. C. Traweek. In this patent heat developing components are affixed to both surfaces of a printed circuit board. The largest heat generators are encapsulated in blocks of electrically insulating, thermally conductive material. The blocks are then sandwiched between a metal chassis and the printed circuit board. The chassis, because of its size, functions as a superior heat sink.

Another patent of interest is U.S. Pat. No. 4,104,700 entitled "Heat Pipe Cooling of Semiconductor Device Packaging Systems", by R.V. Hutchison et al. In this patent heat sinks having posts which cooperate with hold down clamps, clamp heat sink plates attached to integrated circuit packages to printed circuit board heat sinks. Heat pipes and a plenum chamber through which air is circulated, are used to dissipate heat to the ambient air.

Another patent of interest is U.S. Pat. No. 4,535,385 entitled "Circuit Module with Enhanced Heat Transfer and Distribution", by M. C. August et al. In this patent printed circuit boards are mounted in a closely spaced relationship on opposite sides of a flat plate heat sink. Electrical devices, mounted to the surface of the printed circuit boards farthest from the flat plate heat sink, are thermally connected to the heat sink by means of plated-through holes and thermally conductive pads which project through holes in the printed circuit boards to contact the electrical device on one end and the flat plate heat sink on the other end.

A solution to applicants' problem is not readily discernible from a review of the prior art. The problem restated is, how to connect an electronic module, having a metal plate on one surface, to a chassis heat sink which is positioned on the opposite side of a printed circuit board when the electronic module has connectors that must make contact with conductors on the printed circuit board.

SUMMARY OF THE INVENTION

The present invention solves the aforementioned problem with unique metal T-bar devices which are used in pairs with the leg of each T-bar passing through an opening in the printed circuit board for attachment to a metal chassis. The under surface of the cross-bar of the T-bar is provided with stand-off projections that contact the printed circuit board to provide a clearance between the T-bar and the conductors on the printed circuit board. Fasteners are used to fasten the printed circuit board to the under surface of the cross-bar. An electronic (power) module having a metal back plate and a plurality of encapsulated electronic components mounted to one surface of the plate with a plurality of electrical connectors extending from the encapsulated electronic components opposite the metal back plate is affixed to the upper surface of the cross-bar by fasteners. At least one fastener extends through the leg of the T-bar to connect the T-bar to the chassis. The height of the T-bar devices is such that the conductors extending from the electronic module engage conductors on the printed circuit board.

The electronic module may be removed from engagement with the printed circuit board and the T-bar heat sink by removing the fasteners from the top of the cross-bar and pulling the electronic module away. Insertion of a module is accomplished by reversing the removal process. Any soldering or desoldering of the module from the associated printed circuit board is thus eliminated. The printed circuit board can be removed from the chassis by removing the fasteners connecting the legs of the T-bars to the chassis.

Accordingly, it is a primary object of the present invention to provide a new and novel mounting device for connecting printed circuit boards and electronic modules to a heat sink.

It is another object of the present invention to provide a heat transfer device which conducts heat from a heat source, through a printed circuit board, to a heat sink.

These and other objects of the present invention will become more apparent and better understood when taken in conjunction with the following description and the accompanying drawings, throughout which like characters indicate like parts and which drawings form a part of this application.

DESCRIPTION OF THE PREFERRED EMBODIMENT

Figure 1:
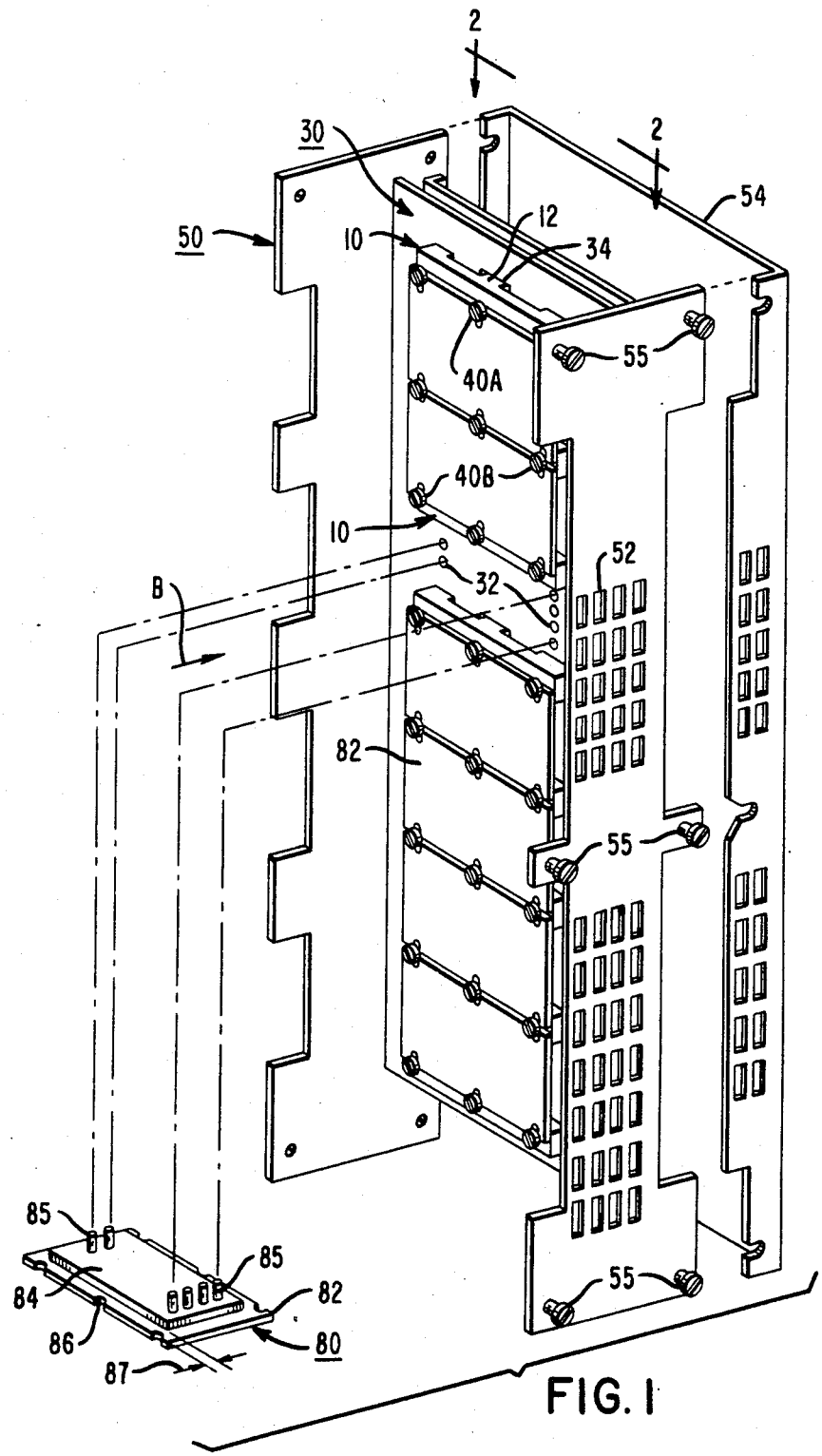
FIG. 1 is a partially exploded, perspective, view of a power converter chassis utilizing the heat transfer device of the present invention.
Figure 2:
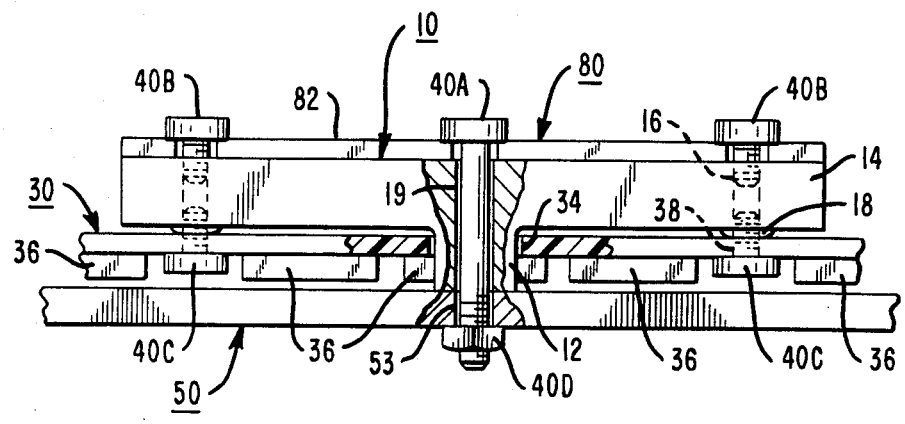
FIG. 2 is a section view taken along the section lines 2—2 in FIG. 1.

Referring to FIGS. 1 and 2, a metal chassis 50 functions as a heat sink and as a structural base for supporting a printed circuit board 30 and a plurality of electronic modules 80. A plurality of heat transfer devices 10, each formed in the shape of a "T", are affixed to the chassis 50 for supporting the printed circuit board 30 and the electronic modules 80 and for conducting heat from the modules 80 to the chassis 50. Each electronic module 80 is comprised of a metal back plate 82 and a block of encapsulated electronic components 84, having electrical connectors 85 projecting from the surface opposite the back plate 82.

Figure 3:
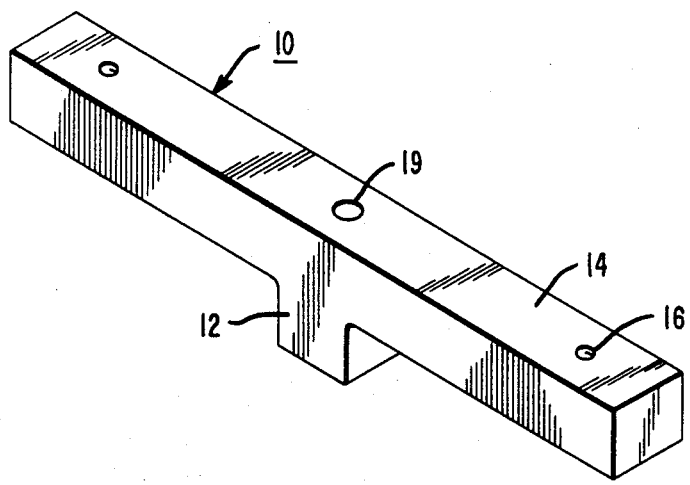
FIG. 3 is a perspective view of the preferred embodiment of the invention.

The width of the back plate 82, as compared to the block of encapsulated components 84, is such that a lip 87 is provided on each side of the block 84 for engaging approximately one-half the width of the upper surface of the cross-bar member 14 of the heat transfer devices 10 (see FIG. 2 and FIG. 3). Notches 86, in the back plate 82, are provided for receiving fasteners 40A and 40B.

Affixed to the printed circuit board 30 are connectors 32 for mating with the electrical connectors 85 of the electronic module 80.

A leg 12, of each "T" shaped heat transfer device 10, extends through openings 34 in the printed circuit board 30 to abut against the chassis 50. The fastener 40A affixes the heat transfer device 10, the module 80, and the printed circuit board 30 to the chassis 50. If needed, air may be passed through a plurality of chassis openings 52 to provide additional cooling to the chassis supported electrical components. Two identical cover plates 54 (only one shown for simplicity) are affixed to the main chassis by sheet metal screws 55. The covers provide an air chamber through which cooling air passes.

Referring to FIG. 2, in conjunction with FIG. 3, the heat transfer device 10 is formed as a truncated T-bar with a cross-bar member 14 and a short leg member 12. Extending through the cross-bar member 14 and the leg member 12 is a hole 19 for receiving the fastener 40A, in the form of a bolt and which extends through the hole 19 and a corresponding hole 53, in the chassis 50, to engage a nut 40D. The nut 40D may be replaced with a screw type insert, formed in opening 53, for receiving the fastener 40A. The top plate 82, of the module 80, fits under the fastener 40A, in the area of a slot 86. The fastener 40A when tightened, rigidly secures the module 80 to the heat transfer device 10 and the heat transfer device 10 to the chassis 50. The printed circuit board 30 is provided with openings 34 to permit the leg 12 of the heat transfer device 10 to pass through the printed circuit board. Projections 18, on the underside of the cross-bar member 14, maintain a distance between the cross-bar member and the surface of the printed circuit board so that the printed circuit board conductors do not touch the heat transfer device 10. A pair of tapped holes 16, positioned on opposite surfaces of the cross-bar member 14, are counter threaded so as to receive the mounting screws 40B and 40C. The mounting screws 40C extend through openings 38 in the printed circuit board 30 and fasten the printed circuit board to the undersurface of the cross-bar member 14. In operation, heat is transferred from the metal plate 82 to the heat transfer device 10 and then to the chassis 50.

Figure 4:
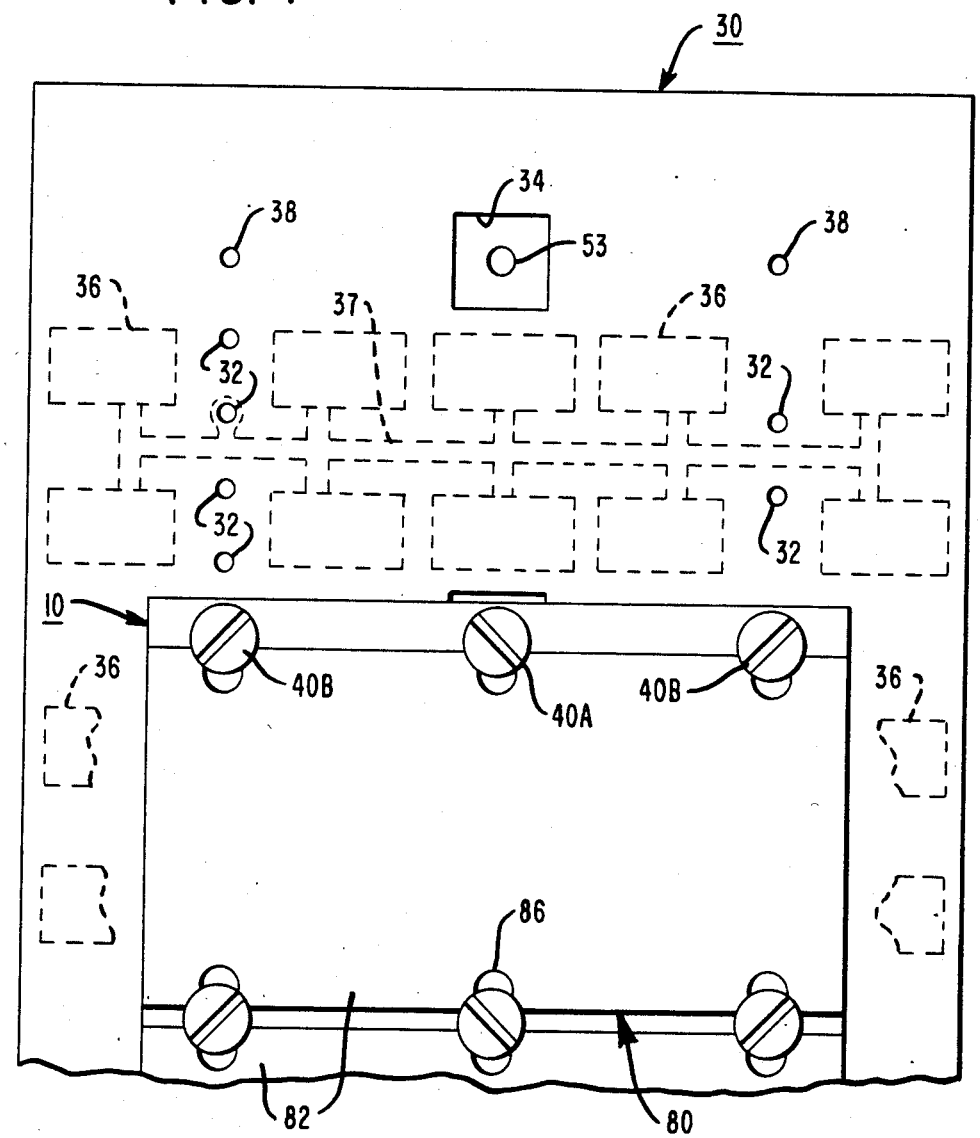
FIG. 4 is an enlarged, fragmented, view of a portion of the power converter chassis of FIG. 1 viewed along the direction indicated by the assembly arrow B.

Referring now to FIG. 4, the printed circuit board 30 is shown populated with IC chips 36 on its undersurface. Although not shown in complete detail, for purposes of simplicity, it is understood that conductors 37, for interconnecting the various IC chips to signal and power sources, may be positioned on either or both sides of the printed circuit board 30. In the disclosed configuration, three of the T-shaped heat transfer devices 10 can support a pair of electronic modules 80.

Removal of the fasteners 40A and 40B, associated with a particular electronic module 80, will permit the module to be removed from the circuit board 30. Removal of all of the 40A fasteners will permit the removal of the printed circuit board from the chassis.

While a preferred embodiment of the invention has been shown and described, various other embodiments and modifications thereof will be apparent to persons skilled in the art and thus will fall within the scope of the invention as defined in the following claims.

We claim:

1. A system that mounts and cools encapsulated electronic modules of the type having a flat plate heat conductor affixed to the encapsulated electronic components on one surface and having a plurality of electrical connectors extending from the encapsulated electric connectors on an opposite surface comprising:
   a chassis heat sink;
   a plurality of heat transfer devices having a cross-bar member and at least one leg member;
   a circuit board having electrical receptacles receiving the electrical connectors of the electronic modules, said circuit board having openings therein through which the at least one leg member of said heat transfer device passes and abuts against said chassis heat sink;
   a plurality of fastener means attaching said circuit board to the cross-bar member of each heat transfer device; and
   a plurality of fastener means attaching each flat plate heat conductor of said encapsulated electronic module to a pair of cross-bar members such that the electrical connectors of said encapsulated electronic module engage the electrical receptacles on said circuit board and at least one of said plurality of fastener means for each of said heat transfer devices extends through said chassis heat sink and affixes said plurality of heat transfer devices to said chassis heat sink.

2. The system according to claim 1 wherein each of said plurality of heat transfer devices is formed with a "T" shape.

3. The system according to claim 1 wherein each of said cross-bar members has at least one projection extending from the surface of the cross-bar member with said at least one leg member to prevent circuit board conductors from contacting the heat transfer device.

4. The system according to claim 1 wherein the width of the cross-bar member of said plurality of heat transfer devices is sufficient to support the flat plates of two encapsulated electronic modules.

5. The system according to claim 1 wherein each of said plurality of heat transfer devices is made of metal.

6. The system according to claim 1 wherein the flat plate heat conductor is in thermal contact with a heat transfer device and wherein said heat transfer device is in thermal contact with said chassis heat sink.

* * * * *